United States Patent [19]

Su et al.

[11] Patent Number: 5,607,602
[45] Date of Patent: Mar. 4, 1997

[54] HIGH-RATE DRY-ETCH OF INDIUM AND TIN OXIDES BY HYDROGEN AND HALOGEN RADICALS SUCH AS DERIVED FROM HCL GAS

[75] Inventors: Yuh-Jia Su, Cupertino; Yuen-Kui Wong, Fremont; Kam S. Law, Union City; Haruhiro Goto, Saratoga, all of Calif.

[73] Assignee: Applied Komatsu Technology, Inc., Tokyo, Japan

[21] Appl. No.: 475,709

[22] Filed: Jun. 7, 1995

[51] Int. Cl.$^6$ ........................................................ B44C 1/22
[52] U.S. Cl. ............................ 216/76; 156/627.1; 216/60
[58] Field of Search ............................. 156/643.1, 646.1, 156/627.1; 216/76, 67, 60, 59

[56] References Cited

U.S. PATENT DOCUMENTS

| | | | |
|---|---|---|---|
| 4,544,444 | 10/1985 | Chang | 156/643 |
| 4,750,980 | 6/1988 | Hynecek | 204/192.35 |
| 4,898,766 | 2/1990 | Tamamura et al. | 428/195 |
| 5,094,978 | 3/1992 | Miyagaki et al. | 437/181 |
| 5,286,337 | 2/1994 | Tsou | 156/643 |
| 5,318,664 | 6/1994 | Saia et al. | 156/643 |

FOREIGN PATENT DOCUMENTS

| | | |
|---|---|---|
| 56-070636 | 6/1981 | Japan. |
| 2158129 | 6/1990 | Japan. |
| 9119325 | 12/1991 | WIPO. |

OTHER PUBLICATIONS

"Silicon Processing For The VLSI Era-Volume 1"; Wolf et al.; Lattice Press; Sunset Beach, Ca.; ©1986; pp. 565–567.

Z. Calahorra, E. Minami, R. M. White, R. S. Muller, Reactive Ion Etching of Indium–Tin–Oxide Films, J. Electrochem. Soc., vol. 136, No. 6, Jun. 1989, pp. 1839–1840.

ULVAC Technical Journal, No. 42, 1995, pp. 31–36.

L. A. Coldren & J. A. Rentschler; Directional reactive–ion–etching of InP with $Cl_2$ containing gases; J. Vac. Sci. Technol., 19(2), Jul./Aug. 1981, pp. 225–230.

G. Bradshaw & A. J. Hughes, Etching methods for indium oxide/tin oxide films; Thin Solid Films, 33 (1976) L5–L8.

T. Ratcheva & M. Nanova, Etching of $In_2O_3$:Sn and $In_2O_3$:Te thin films in dilute HCl and $H_3PO_4$; Thin Solid Films 141 (1986) L87–L89.

M. Inoue et al., Patterning Characteristics of ITO Thin Films; Japanese Journal of Applied Physics, vol. 28, No. 2, Feb., 1989, pp. 274–278.

M. Mohri et al., Plasma Etching of ITO Thin Films Using a $CH_4/H_2$ Gas Mixture; Japanese Journal of Applied Physics, vol. 29, No. 10, Oct., 1990, pp. L1932–L1935.

I. Adesida et al., Etching of indium tin oxide in methane/hydrogen plasmas; J. Vac. Sci. Technol. B9(6), Nov./Dec. 1991, pp. 3551–3554.

Primary Examiner—R. Bruce Breneman
Assistant Examiner—George Goudreau
Attorney, Agent, or Firm—Fliesler, Dubb, Meyer & Lovejoy

[57] ABSTRACT

An RIE method and apparatus for etching through the material layer of a transparent-electrode (ITO) in a single continuous step at a rate better than 80 Å/min is disclosed. Chamber pressure is maintained at least as low as 30 mTorr. A reactive gas that includes a halogen hydride such as HCl is used alone or in combination with another reactive gas such as $Cl_2$. Plasma-induced light emissions of reaction products and/or the reactants are monitored to determine the time point of effective etch-through.

28 Claims, 1 Drawing Sheet

HIGH-RATE DRY-ETCH OF INDIUM AND TIN OXIDES BY HYDROGEN AND HALOGEN RADICALS SUCH AS DERIVED FROM HCL GAS

CROSS REFERENCE TO RELATED APPLICATIONS

The following copending U.S. patent application(s) is/are assigned to the assignee of the present application, is/are related to the present application and its/their disclosures is/are incorporated herein by reference:

(A) Ser. No. 08/273,382 filed Jul. 11, 1994 by Jerry Wong et al. and entitled, METHOD AND APPARATUS FOR ETCHING FILM LAYERS ON LARGE SUBSTRATE.

BACKGROUND

1. Field of the Invention

The invention is generally directed to plasma etching of indium and tin oxides. The invention is more specifically directed to reactive ion etch (RIE) of indium tin oxide (ITO) by reactive gases that include hydrogen and a halogen (such as HCl gas).

2. Description of the Related Art

Opto-electronic devices such as liquid crystal displays (LCD's), charge coupled sensor devices (CCD's) and the like often include thin-film transparent electrodes disposed over a light transmitting or light receiving element.

The transparent electrodes are typically composed of an oxide of indium (InO) or an oxide of tin (SnO) or a mixture of these oxides or a compound having the general formulation: $In_xSn_yO_z$, where the z factor is greater than zero but less than 100%. The formulation, $In_xSn_yO_z$ is commonly known in the art as ITO.

During manufacture, a thin-film of the material making up the transparent electrodes is deposited on a substrate. The thin-film is thereafter selectively etched so as to remove pre-specified portions and thereby define a desired wiring pattern.

It is generally desirable in mass-production situations to etch the transparent-electrode thin-film in such a way that the etching does not significantly damage any underlying structures.

It is also generally desirable to perform the etch as quickly as possible and with as few steps as necessary in order to reduce mass-production complexity and costs.

Until recently, the most common method for selective etch of ITO was to wet etch through a photo-lithographically patterned mask using chemically-reactive aqueous agents such as ferric chloride ($FeCl_3$).

Wet etching has drawbacks though. It tends to leave a liquid residue, which residue often needs to be removed prior to further processing. The residue removal step complicates the overall process and disadvantageously increases costs.

Another drawback of wet etching is that its material removal rate tends to be highly sensitive to temperature variations. Tight temperature control is needed to compensate and prevent over or under etching. This also complicates the overall process and increases costs. ('Under etching' refers here to the condition where the transparent-electrode thin-film is not etched through thoroughly and undesired shorts appear in the resultant conductor pattern. 'Over etching' refers here to the condition where the transparent-electrode thin-film is etched through thoroughly and undesired etching of the underlying substrate begins and/or time and resources are wasted in trying to etch to a depth beyond that needed.)

Yet a further drawback of wet etching is that it is isotropic. Over etching may lead to undesired undercutting beneath the etch mask. The undercutting may be so extensive that it leads to unintended open circuits in the conductor pattern.

More recently, attempts have been made to overcome the problems of wet etching by instead dry etching the material layer of the thin-film transparent electrodes with anisotropic reactive plasma.

U.S. Pat. No. 5,094,978, issued Mar. 10, 1992 to Miyagaki et al., METHOD OF PATTERNING A TRANSPARENT CONDUCTOR, reports successful dry etching of ITO with nitrogen trifluoride ($NF_3$). Miyagaki indicates that it is not possible to dry etch materials such as ITO, $In_2O_3$ and $SnO_2$ with a reactive halogen gas (col. 3, lines 22–27).

A more recent U.S. Pat. No. 5,318,664, issued Jun. 7, 1994 to Saia et al., PATTERNING OF INDIUM-TIN OXIDE VIA SELECTIVE REACTIVE ION ETCHING, indicates limited success with plasma etching of ITO using HCl. Saia reports an etch rate of as much as 60 Angstroms per minute (60 Å/min) for plasma etching of ITO with HCl. Saia cautions, however, that HCl should not be used for concluding the etch-through of ITO because HCl is not selective with respect to any underlying silicon. Saia teaches to instead use a non-halogenated gas such as an acetone/oxygen plasma for completion of the etching through of the ITO layer.

Multi-step plasma etch processes such as that taught by Saia (5,318,664) are disadvantageous in that the switching over from one etch process (e.g., HCl plasma) to another (e.g., acetone/oxygen plasma) complicates the overall manufacturing process, increases costs and tends to reduce yields. The 60 Å/min etch rate reported by Saia for etching ITO with an HCl plasma is relatively slow for mass production needs.

SUMMARY OF THE INVENTION

It is an object of the invention to provide single-step etch-through of a thin-film that consists essentially of indium or tin oxides or ITO.

It is a further object of the invention to provide an etch rate of better than 60 Å/min for a plasma etch using halogen-based reactive gases.

In accordance with one aspect of the invention, a transparent-electrode material layer consisting essentially of oxides of indium (InO) and/or of oxides of tin (SnO) and/or of ITO ($In_xSn_yO_z$) is dry etched with a halogen-containing reactive gas under a low pressure of 30 milliTorr or less ($\leq$30 mTorr) and more preferably 20 mTorr or less.

In accordance with a second aspect of the invention, a single process step is used to etch completely through the material layer of the transparent electrode.

In accordance with a third aspect of the invention, the dry etch exhaust from the transparent electrode material layer is spectroscopically analyzed to determine when effective etch-through has been achieved. The etch process is halted at that point to prevent undesired etching into underlying material and/or to minimize consumption of power and materials.

Experiments by the present inventors show that reducing chamber pressure below 30 mTorr significantly increases the etch rate of a reactive ion etch process that uses a reactive halogen gas such as HCl or $Cl_2$. Etch rates as high as 400 Å/min are realized under appropriate conditions (HCl at 10 mTorr and 2 $W/cm^2$).

BRIEF DESCRIPTION OF THE DRAWINGS

The invention will be described with reference to the following drawing(s) in which.

DETAILED DESCRIPTION

Figure 1:
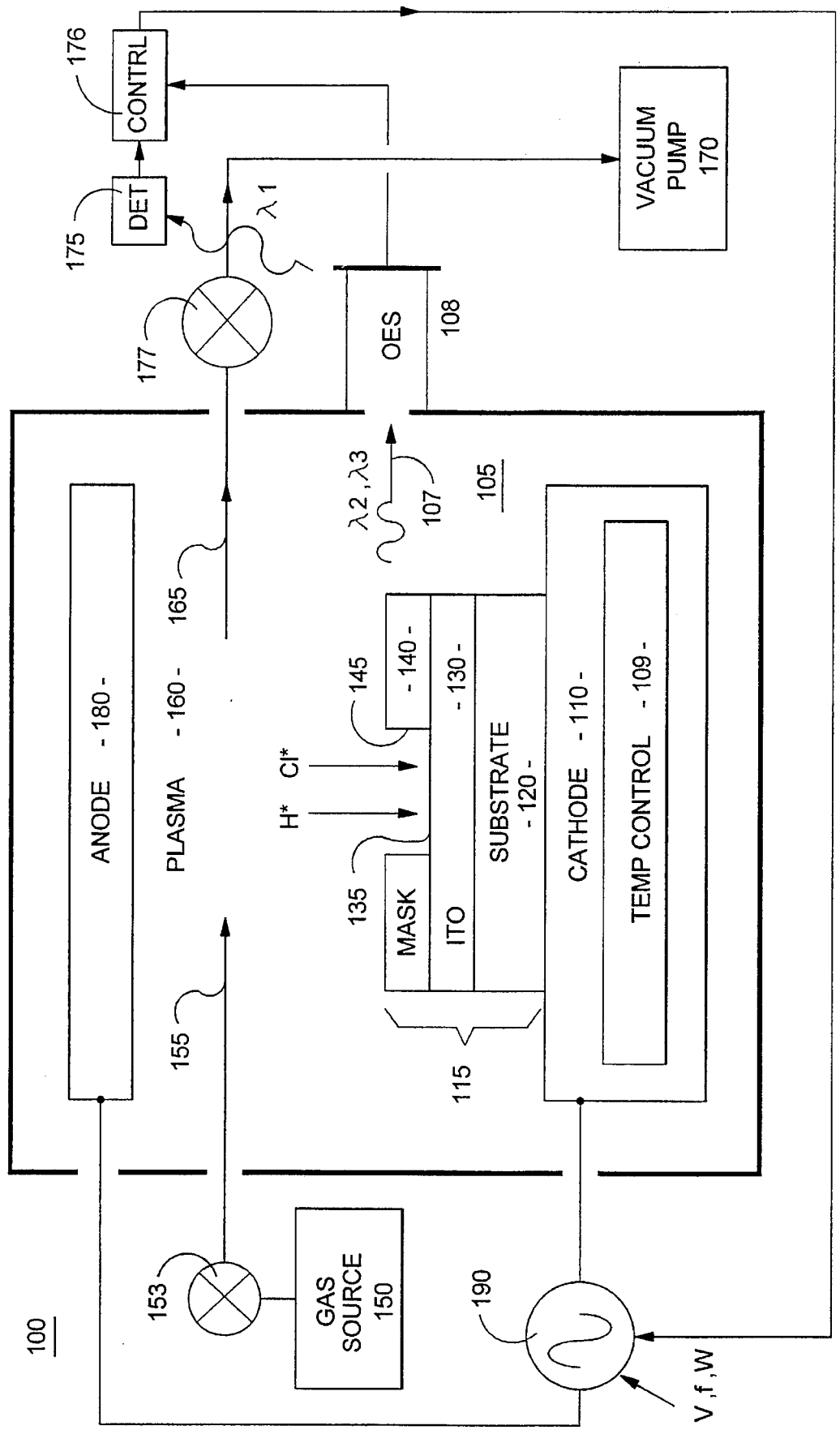
FIG. 1 is a cross-sectional schematic of a reactive ion etch (RIE) system for carrying out a dry etch process in accordance with the invention.

FIG. 1 schematically shows in cross-section a reactive ion etch system 100 in accordance with the invention. (A more detailed mechanical description of the basic etching apparatus may be found for example in the above-cited application Ser. No. 08/273,382.)

System 100 includes a substrate-supporting cathode 110 that is spaced-apart from an opposed anode 180 within a low-pressure chamber 105. Anode 180 may be a discrete element as shown or it may defined by one or more of the inner walls of the etch chamber 105 rather than being a separate element. In one embodiment, the chamber inner walls define the anode and the cathode is placed centrally within the chamber so that multiple faces of the cathode oppose corresponding inner walls of the chamber. The latter embodiment allows for simultaneous etch of two or more workpieces in one chamber.

A radio frequency (RF) generator 190 is coupled electrically to the cathode and anode for producing an RF field between the opposed faces of the cathode and anode. The RF field may be of a single frequency or multiple frequencies. (Typically a combination is used of approximately 13 MHz for plasma creation and approximately 400 KHz for ion acceleration).

A gas supply means 150 is operatively coupled to the low-pressure chamber 105 for supplying a halogen-containing reactive gas 155 into chamber 105. A flow-rate control means (e.g., a valve) 153 is provided for regulating the inflow rate of the reactive gas 155 so as to maintain a desired level of inflow (e.g., 50 sccm which is the flow of gas which fills up per minute a volume of 50 cc to a pressure of 1 atm at 0° C.). Preferably there is no inert carrier gas such as argon, helium or nitrogen in the input gas stream because more work is needed to exhaust this additional material for purposes of maintaining low pressure, however, one may use one or more such inert gases as a carrier for the reactive gas 155 if desired.

A vacuum means 170 is coupled to the low-pressure chamber 105 for evacuating exhaust gases 165 from the chamber 105 and for maintaining a desired low pressure within the chamber 105.

A spectroscopic analyzer means 175 is provided along the exhaust path of vacuum means 170 for optically scanning the exhaust gases 165, analyzing the results and thereby determining the chemical composition of the exhaust gases 165. The spectroscopic analyzer means 175 is preferably designed to distinguish between exhaust gases 165 that do or do not contain one or more compounds in the byproduct group consisting of: water vapor ($H_2O$), indium chlorides ($In_xCl_y$), tin chlorides ($Sn_xCl_y$), and tin hydrides (SnH). In one embodiment, spectroscopic analyzer means 175 includes an optical detector that is sensitive in the visible light range of λ1 equal to approximately 450 to 452 nanometers.

The spectroscopic analyzer means 175 is coupled to an etch-control means 176 that turns off the RF generator 190 and thereby halts the etch process when the analyzer means 175 indicates that effective etch-through has been achieved.

The term 'effective etch-through' is used here to mean the condition when etching has progressed sufficiently far into the transparent-electrode layer so that a useable wiring pattern is created in the transparent-electrode layer without leaving behind undesired shorts or low resistance paths between conductors of that layer that are to be electrically isolated from one another.

Provided in the same embodiment or separately in another embodiment, there is a second spectroscopic detector means referred to as an OES (Optical Emission Spectroscope) 108 installed approximately in line with the workpiece surface so as to detect plasma induced light emission λ2 of In or Sn in the approximate plane 107 of surface portion 135. The OES 108 is coupled to the etch-control means 176 so as to turn off the RF generator 190 and thereby halt the etch process when effective etch-through is indicated to have been reached by an empirically-determined reduction in λ2 emissions of In or Sn in the approximate plane 107.

The OES 108 has a faster response time than the exhaust spectroscopic analyzer means 175 because the OES 108 does not wait for exhaust gases to reach it. When used in combination with the OES 108, the exhaust spectroscopic analyzer means 175 may be used to verify readings obtained from the OES 108 to assure that the OES 108 is operating correctly before plasma shut off occurs.

Another way that the time point of effective etch-through of material layer 130 can be determined is by looking for peaks in plasma induced light emission λ3 of H and/or Cl in the approximate plane 107 of surface portion 135. While there is still In or Sn available for reaction with and consumption of H and/or Cl in the vicinity surface portion 135, the concentration of H and/or Cl remains diminished in this vicinity. However, once effective etch-through has been achieved, there is a substantial decrease in the In or Sn available for reaction with H and/or Cl and a concentration peak shows in the wavelengths of H and/or Cl. The RF generator 190 can be turned off in response to detection of such a peak in the monitored wavelengths of H and/or Cl to thereby halt the etch process at the point of etch-through.

Alternatively, the combination of H and/or Cl emission peaks and In and/or Sn emission minima may be used to determine the time point for turning off RF generator 190.

In yet another variation, if the material of substrate 120 is susceptible to etching by H and/or Cl radicals, then OES 108 can be further used to detect plasma induced light emission by the released constituents of substrate 120 as etch-through is achieved and the detection of this event may also be used to determine the time point for turning off RF generator 190.

A pressure regulating means 177 is provided along the exhaust path of vacuum means 170 for maintaining a desired pressure level within chamber 105. The desired pressure level is preferably at least as low as approximately 30 mTorr, more preferably at least as low as approximately 20 mTorr, and even more preferably at least as low as approximately 10 mTorr.

A workpiece 115 having a to-be-etched transparent-electrode material layer 130 is mounted on cathode 110. The workpiece 115 typically includes a substrate 120 onto which the transparent-electrode material layer 130 is deposited. The substrate 120 may be composed of one or more layers of materials such as glass ($SiO_2$) or silicon nitride ($Si_3N_4$) or amorphous silicon (a—Si) or poly or monocrystalline silicon (p—Si or Si) or other materials as may be suitable for a specific opto-electronic application.

The transparent-electrode material layer 130 may be a thin-film having a thickness of 1500 Å or less and consisting essentially of ITO or an indium oxide or a tin oxide or a mixture of these oxides.

A pre-patterned mask 140 that has been formed by photolithography or other suitable means is provided above the to-be-etched material layer 130. Mask 140 has an aperture 145 defined therethrough for exposing a surface portion 135 of the to-be-etched transparent-electrode material layer 130. Unexposed portions of material layer 130 are protected from etching by the material of the mask 140. Mask 140 may be composed of materials such as photoresist deposited to a thickness of 1.5 μm.

Chamber 105 is appropriately sealed to maintain pressures therein at least as low as 30 mTorr, and more preferably at least as low as 10 mTorr in the vicinity of workpiece 115. The vacuum means 170 is operated so as to exhaust gases from chamber 105 and to create a pressure within the chamber of approximately 30 mTorr or less, and more preferably 20 mTorr or less, and even more preferably 10 mTorr or less.

The RF generator 190 is activated by etch-control means 176 so as to provide an oscillating electric field between the cathode 110 and anode 180 for etching through the exposed portion of material layer 130 in a single step and stopping after effective etch-through has been achieved.

The frequency (f) of the generated RF field is preferably in the range of approximately 400 KHz to 13.6 MHz. If desired, the generated RF field may have a combination of multiple frequencies such as both 13.6 MHz and 400 KHz and these combined multiple frequencies may be developed by separate oscillators. The lower frequency field is often developed so as to predominate in the vicinity of the substrate-supporting cathode 110 and is referred to as the pedestal RF. The higher frequency field is often developed so as to predominate in the vicinity of the plasma above the workpiece 115 and is referred to as the plasma RF.

The power density (W) of the applied RF field is preferably at least 1 watt per centimeter squared (1 $W/cm^2$) approximately as measured relative to the exposed surface area 135 of material layer 130 and more preferably, approximately 2 $W/cm^2$ or more.

The intensity (volts/cm) of the RF field is sufficiently large to disassociate the next-described reactive gas 155 into atomic constituents (free radicals). In one embodiment, field intensity in the range of 300 to 800 volts/cm is created in the vicinity of the exposed surface portion 135 of material layer 130.

Gas source 150 supplies a steady stream of a halogen-containing reactive gas 155 such as HCl or $Cl_2$ or a mixture of HCl and $Cl_2$. A reactive gas consisting essentially of halogen hydride such as HCl is preferred.

The flow rate of the supplied reactive gas is preferably 50 to 100 sccm.

A temperature control means 109 (e.g., a fluid-cooled heat exchange) is coupled to the cathode 110 for maintaining a cathode temperature in the range of approximately 10° C. to 100° C. The temperature of substrate 120 is preferably maintained at approximately 120° C. or less and more preferably at 100° C. or less to prevent damage to the films on the substrate 120. The temperature of the substrate 120 is determined by thermal transfer through the cathode 110 to temperature control means 109. The temperature in the plasma 160 that forms in the vicinity of surface portion 135 can be significantly higher and tends to be sporadic as the plasma fluctuates. TABLE-1 shows experimental results obtained for the case where the to-be-etched material layer 130 consists essentially of ITO and the reactive gas supplied from source 150 consists essentially of HCl at 50 sccm. RF generator 190 was set to a single frequency of 13.6 MHz for both pedestal and plasma and its power level was set to define a power density of 1 $W/cm^2$ relative to the exposed surface 135 of ITO layer 130.

TABLE 1

| Chamber Pressure (milliTorr) | ITO Etch Rate (Å/min) |
|---|---|
| 30 | 80 |
| 20 | 140 |
| 10 | 240 |

As seen in TABLE-1, the etch rate increases substantially as the chamber pressure is dropped from 30 to 10 mTorr. The mechanisms behind this observed increase of etch-rate are not fully understood but are believed to be due to enhancement of the physical ion bombardment that results in microfragmentation of the exposed ITO surface 135. The pressure reduction is believed to reduce frictional resistance to the acceleration of ions by the RF field and to thereby produce more energetic bombardment. It is expected that higher etch rates will be obtainable by reducing the RF frequency below 13.6 MHz and closer to the range of 400 KHz or by adding a lower frequency component to the pedestal RF. Lower frequencies tend to provide higher levels of physical ion bombardment because they give the more massive ones of the generated ion particles more time to accelerate in response to the instantaneous electric field.

A second experiment was performed as indicated in TABLE-2 to see the effect of power density for the case of the material layer 130 consisting essentially of ITO, of the gas source 150 supplying a reactive gas consisting essentially of HCl at 50 sccm, and of a chamber pressure maintained at 10 mTorr. The frequency was the same as the case for Table-1.

TABLE 2

| Power Density ($W/cm^2$) | Etch Rate (Å/min) |
|---|---|
| 1 | 240 |
| 2 | 400 |

As seen in TABLE-2, the etch rate may be significantly increased by increasing the effective power density.

In a third experiment a reactive gas 155 consisting essentially of chlorine ($Cl_2$) was substituted for the one consisting essentially of HCl while all other settings remained the same. Similar results were observed except that the etch rate was reduced by approximately 10% to 15%. It is believed one or both of a chemical mechanism and/or an in-electric-field disassociation mechanism is responsible for the observed higher etch-rates of HCl as compared to those of $Cl_2$. In other words, the combination of freed radicals of both types, H* and Cl* (hydrogen and halogen), may drive more reactions that volatilize ITO as compared to a reactive gas 155 that consists only of chlorine ($Cl_2$).

In more general terms, the observed higher etch rates in low pressure are believed to be due to both chemical and mechanical mechanisms. The applied HCl gas dissociates in the presence of the RF energy field to form free radicals H* and Cl*, where the symbol * indicates that each respective radical may be charged or uncharged. Electrically charged ones of the freed radicals (ions) are accelerated by the RF field to bombard the exposed thin-film surface 135. This bombardment is believed to result in physical breakup or micro-fragmentation of the exposed surface 135. The microfragments then react chemically with either the charged or uncharged radicals, H* and Cl*.

The following TABLE-3 lists the chemical reactions that are believed to occur between the freed constituents H* and Cl* and In and Sn and O to produce volatile byproducts.

TABLE 3

| 1st reactant | 2nd reactant | Volatile byproducts |
| --- | --- | --- |
| Cl* | In | $In(ClO_4)_3.8(H_2O)$, $InCl_2$, InCl, $InCl_3$ |
| H* | Sn | SnH, $SnCl_4.5(H_2O)$ |
| Cl* | Sn | $SnCl_4.4(H_2O)$, $SnCl_4.3(H_2O)$ |
| H* | O | $H_2O$ |

The byproducts listed in TABLE-3 all have boiling points below 650° C. and are thus believed to be possibly volatile within the plasma environment. As seen, each of the dissociated particles H* and Cl* of HCl gas generates volatile byproducts when reacted with ITO. The specific ratio of H* and Cl* particles in the plasma may be varied as desired by mixing suitable combinations of HCl and $Cl_2$ so as to accommodate for different formulations of $In_xSn_yO_z$.

The above disclosure is to be taken as illustrative of the invention, not as limiting its scope or spirit. Numerous modifications and variations will become apparent to those skilled in the art after studying the above disclosure.

By way of example, the reactive gas consisting of HCl may be replaced by or mixed with other halogen hydrides such as HF, HBr, HI or $C_2H_5I$.

Given the above disclosure of general concepts and specific embodiments, the scope of protection sought is to be defined by the claims appended hereto.

What is claimed is:

1. An etch-through method comprising the steps of:

(a) providing a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is substantially greater than zero but less than 100% and where the sum x+y fills the remainder of the 100%, and a mixture of the preceding ones of said group members;

(b) supplying a reactive gas including hydrogen chloride (HCl) to a vicinity of the material layer at a pressure of no more than 30 milliTorr;

(c) applying an electric field to react the supplied reactive gas with the material layer so as to form volatile byproducts of the reactive gas and the material layer; and continuing said steps (b) and (c) until the material layer is etched through.

2. An etch method according to claim 1 wherein the applied electric field has a power density of at least approximately 1 watt per centimeter squared (1 W/cm$^2$) as measured relative to exposed surface area portions of the material layer.

3. An etch method according to claim 2 further comprising the step of:

(d) providing a mask layer over the material layer, the mask layer having one or more apertures defined through the mask layer for exposing a corresponding one or more prespecified surface portions of the material to the products of the reactive gas and the applied electric field.

4. An etch method according to claim 3 further comprising the steps of:

(e) providing a substrate below the material layer;

(f) determining when the etch process effectively cuts clean through the material layer and begins to attack the substrate; and (g) halting the etch process at or about the time of said determination that the etch process has effectively cut clean through the material layer and has begun to attack the substrate.

5. An etch method according to claim 1 wherein the supplied reactive gas consists essentially of hydrogen chloride (HCl).

6. An etch method according to claim 1 wherein the supplied reactive gas consists essentially of a mixture of hydrogen chloride (HCl) and chlorine ($Cl_2$).

7. An etch method according to claim 1 wherein for said supplying step (b) the pressure of the supplied reactive gas in said vicinity is no more than approximately 20 milliTorr.

8. An etch method according to claim 1 wherein for said supplying step (b) the pressure of the supplied reactive gas in said vicinity is no more than approximately 10 milliTorr.

9. An etch method according to claim 1 wherein the applied electric field is an RF field having a frequency of approximately 400 KHz or more.

10. An etch method according to claim 1 wherein said step (c) of applying an electric field includes:

(c.1) including an anisotropic component in said electric field for anisotropically accelerating charged components towards bombardment of said material layer.

11. An etch method according to claim 1 further comprising the step of:

(d) providing a mask layer over the material layer, the mask layer having one or more apertures defined through the mask layer for exposing a corresponding one or more prespecified surface portions of the material to the products of the reactive gas and the applied electric field.

12. An etch method according to claim 11 further comprising the steps of:

(e) providing a substrate below the material layer;

(f) determining when the etch process effectively cuts clean through the material layer and begins to attack the substrate; and (g) halting the etch process at or about the time of said determination that the etch process has effectively cut clean through the material layer and has begun to attack the substrate.

13. An etch method according to claim 1 wherein said step (b) of supplying includes:

(b.1) maintaining a flow rate of 50 to 100 sccm for said reactive gas.

14. The etch method of claim 1 further comprising the steps of:

(d) monitoring spectroscopic data obtained from one or more members of a reaction group consisting of In and Sn and Cl; and (e) automatically halting said etch process at a time point where effective etch-through of said material layer is indicated to have been achieved by the monitored spectroscopic data.

15. The etch method of claim 14 wherein said step of monitoring includes:

(d.1) monitoring plasma-induced light emissions from one or more members of said group consisting of In and Sn and Cl.

16. The etch method of claim 15 wherein said step of monitoring further includes:

(d.2) using an optical emission spectroscope for directly collecting and monitoring said plasma-induced light emissions along an unobstructed plane extending adjacent to said vicinity of the material layer.

17. The etch method of claim 14 wherein said reaction group further consists of hydrogen.

18. An etch-through method comprising the steps of:

(a) providing a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is greater than zero but less than 100%, and a mixture of the preceding ones of said group members;

(b) supplying a reactive gas including hydrogen chloride (HCl) to a vicinity of the material layer at a pressure of no more than 30 milliTorr;

(c) applying an electric field in said vicinity for dissociating the supplied reactive gas to form free radicals including free chlorine radicals that both physically bombard the material layer and react chemically with constituents of the material layer so as to form volatile byproducts; and continuing said steps (b) and (c) until the material layer is etched through.

19. An etch method according to claim 12 wherein said mask is composed of photoresist.

20. An etch method according to claim 18 further comprising the step of:

(d) providing a mask layer over the material layer, the mask layer being composed of photoresist and having one or more apertures defined through the mask layer for exposing a corresponding one or more prespecified surface portions of the material to the free radicals.

21. A system for etching-through a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is greater than zero but less than 100%, and a mixture of the preceding ones of said group members, said system comprising:

(a) a chamber for supporting the material layer therewithin;

(b) supply means for supplying a halogen-based reactive-gas into the chamber, said reactive-gas including hydrogen chloride (HCl);

(c) vacuum means for maintaining a pressure not exceeding 30 milliTorr within the chamber;

(d) field generator means for developing an oscillating electric field within the chamber and thereby reacting said reactive-gas with the material layer supported within the chamber; and (e) etch-through control means, coupled to said field generator means, for automatically discontinuing said electric field when effective etch-through of the material layer is achieved.

22. A system according to claim 21 wherein said vacuum means can maintain a pressure not exceeding approximately 10 milliTorr within the chamber.

23. A system according to claim 21 wherein said etch-through control means includes:

(e.1) detector means for optically detecting effective etch-through of said material layer; and (e.2) power-control means, responsive to the detector means, for automatically deactivating the field generator means when effective etch-through is detected by the detector means.

24. A system according to claim 23 wherein said detector means includes an optical emission spectroscope (OES) for detecting plasma induced light emission associated either with elements of said material layer or elements of a substrate underlying the material layer.

25. A system according to claim 23 wherein said detector means includes:

exhaust analyzer means, provided along an exhaust path of said vacuum means, for optically scanning exhaust gases passing therethrough and for thereby determining the chemical composition of the exhaust gases.

26. A system according to claim 25 wherein said detector means further includes:

an optical emission spectroscope (OES) for detecting plasma induced light emission associated either with elements of said material layer or elements of a substrate underlying the material layer.

27. An etch method according to claim 4 further comprising the step of:

maintaining a temperature of said substrate at or less than 100° C.

28. An etch method according to claim 4 wherein said mask is composed of photoresist.

\* \* \* \* \*